(12) United States Patent
Wang

(10) Patent No.: US 7,170,160 B1
(45) Date of Patent: Jan. 30, 2007

(54) CHIP STRUCTURE AND STACKED-CHIP PACKAGE

(75) Inventor: Jiunheng Wang, Tainan County (TW)

(73) Assignees: ChipMOS Technologies, Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 11/301,860

(22) Filed: Dec. 12, 2005

(30) Foreign Application Priority Data

Sep. 15, 2005 (TW) ............................. 94131797 A

(51) Int. Cl.
*H01L 23/02* (2006.01)
*H01L 23/48* (2006.01)

(52) U.S. Cl. ............... 257/686; 257/690; 257/E25.006; 257/E23.085; 438/109

(58) Field of Classification Search ................ 257/686, 257/E25.006, E21.021, E25.027, E23.085; 438/109
See application file for complete search history.

(56) References Cited

U.S. PATENT DOCUMENTS 7,034,388 B2* 4/2006 Yang et al. ................. 257/686
2001/0003375 A1* 6/2001 Kovats et al. .............. 257/685
2003/0094683 A1* 5/2003 Poo et al. ................... 257/686
2004/0245630 A1* 12/2004 Huang et al. ............... 257/737
2005/0167798 A1* 8/2005 Doan ......................... 257/678

* cited by examiner

*Primary Examiner*—Long Tran
(74) *Attorney, Agent, or Firm*—J.C. Patents

(57) ABSTRACT

A chip structure including a chip, a first passivation layer, a redistribution layer and a second passivation layer is provided. The chip has a wire bonding area adjacent to one side or two sides adjacent to each other of the chip, wherein the chip has multiple first bonding pads disposed inside the wire bonding area and multiple second pads disposed outside the wire bonding area. The first passivation layer disposed on the chip has multiple first openings by which the first and the second bonding pads are exposed. The redistribution layer is disposed on the first passivation layer and extended from the second bonding pads to the wire bonding area. The redistribution layer has multiple third bonding pads located inside the wire bonding area. The second passivation layer disposed over the redistribution layer has multiple second openings by which the first and the third bonding pads are exposed.

13 Claims, 5 Drawing Sheets

CHIP STRUCTURE AND STACKED-CHIP PACKAGE

CROSS-REFERENCE TO RELATED APPLICATION

This application claims the priority benefit of Taiwan application serial no. 94131797, filed on Sep. 15, 2005. All disclosure of the Taiwan application is incorporated herein by reference.

BACKGROUND OF THE INVENTION

1. Field of the Invention

The present invention relates to a chip structure and a chip package structure, and more particularly, to a chip structure having a redistribution layer and a stacked-chip package comprising the chip structures.

2. Description of the Related Art

In the contemporary information world, consumers continuously pursue electronic apparatus with higher speed, better quality and more functions. For the product outlook, an electronic apparatus is required to be lighter, thinner, shorter and smaller. In order to achieve this object, the system integration concept has been introduced in the circuit design by the manufacturers, such that one single chip may provide multiple functions and less number of chips is disposed in an electronic apparatus. In addition, for the electronic package technique, in order to adapt with the trend of lighter, thinner, shorter and smaller, various package design concepts such as the multi-chip module (MCM), the chip scale package and the stacked multi-chip package have also been developed.

FIG. 1A is a schematic sectional view of a stacked-chip package comprising multiple chips with an identical or similar chip scale. Referring to FIG. 1A, the conventional stacked-chip package 100 comprises a circuit substrate 110, a chip 120a, a chip 120b, a spacer 130, a plurality of bonding wires 140 and an encapsulant 150. A plurality of bonding pads 112 is disposed on the circuit substrate 110, and a plurality of bonding pads 122a and 122b is disposed on the chips 120a and 102b, respectively. The bonding pads 122a and 122b are disposed on the chips 120a and 120b with peripheral type arrangement. The chip 120a is disposed on the circuit substrate 110, and the chip 120b is disposed over the chip 120a and a spacer 130 is disposed between the chip 120a and the chip 120b. Two ends of some bonding wires 140 are respectively connected to the bonding pads 112 and 122a by a wire bonding process, such that the chip 120a is electrically connected to the circuit substrate 110. In addition, two ends of some other bonding wires 140 are respectively connected to the bonding pads 112 and 122b by the wire bonding process, such that the chip 120b is electrically connected to the circuit substrate 110. Moreover, the encapsulant 150 disposed on the circuit substrate 110 encapsulates the bonding wires 140, the chip 120a and the chip 120b.

Since the bonding pads 122a and 122b are disposed on the chips 120a and 120b with peripheral type arrangement, the chip 120a cannot directly hold the chip 120b. Therefore, a spacer 130 is disposed between the chip 120a and the chip 120b in the conventional technique, such that an appropriate gap exists between the chip 120a and the chip 120b for performing a subsequent wire bonding process. However, using the spacer 130 inevitably increases the thickness of the conventional stacked-chip package 100.

In order to reduce the thickness of the conventional stacked-chip package, the conventional technique further provides another stacked-chip package comprising multiple chips with a different chip scale as shown in the schematic sectional view of FIG. 1B. Referring to FIG. 1B, the conventional stacked-chip package 100' comprises a circuit substrate 110, a chip 120c, a chip 120d, a plurality of bonding wires 140 and an encapsulant 150. A plurality of bonding pads 112 is disposed on the circuit substrate 110. Here, the chip 120c is larger than the chip 120d. In addition, a plurality of bonding pads 122c and 122d is disposed on the chips 120c and 120d, respectively. The bonding pads 122c and 122d are disposed on the chips 120c and 120d with peripheral type arrangement. The chip 120c is disposed on the circuit substrate 110, and the chip 120d is disposed on the chip 120c. Two ends of some bonding wires 140 are respectively connected to the bonding pads 112 and 112c by the wire bonding process, such that the chip 120c is electrically connected to the circuit substrate 110. In addition, two ends of some other bonding wires 140 are respectively connected to the bonding pads 112 and 112d by the wire bonding process, such that the chip 120d is electrically connected to the circuit substrate 110. Moreover, the encapsulant 150 disposed on the circuit substrate 110 encapsulates the bonding wires 140, the chip 120c and the chip 120d.

Since the chip 120d is smaller than the chip 120c, the chip 120d does not cover the bonding pads 122c on the chip 120c when the chip 120d is disposed on the chip 120c. However, when multiple chips with different scales are stacked to form the stacked-chip package 100' with the method mentioned above in the conventional technique, since the chip disposed on the higher layer has less scale, there is a limitation of the number of chips to be stacked in the stacked-chip package 100'.

SUMMARY OF THE INVENTION

The present invention is directed to provide a chip structure where more chips can be stacked in a limited space.

The present invention is directed to provide a stacked-chip package that provides higher package integrity and less thickness.

A chip structure including a chip, a first passivation layer, a redistribution layer and a second passivation layer is provided by the present invention. The chip has a wire bonding area adjacent to one side or two sides adjacent to each other of the chip. The chip has a plurality of first bonding pads disposed inside the wire bonding area and a plurality of second pads disposed outside the wire bonding area. The first passivation layer disposed on the chip has a plurality of first openings by which the first and the second bonding pads are exposed. The redistribution layer is disposed on the first passivation layer and extended from the second bonding pads to the wire bonding area. The redistribution layer has a plurality of third bonding pads located inside the wire bonding area. The second passivation layer disposed over the redistribution layer has a plurality of second openings by which the first and the third bonding pads are exposed.

A stacked-chip package including a circuit substrate, a plurality of chip structures and a plurality of bonding wires is further provided by the present invention. Each chip structure comprises a chip, a first passivation layer, a redistribution layer and a second passivation layer. The chip has a wire bonding area adjacent to one side or two sides adjacent to each other of the chip, wherein the chip has a plurality of first bonding pads disposed inside the wire bonding area and a plurality of second pads disposed outside the wire bonding area. The first passivation layer disposed on the chip has a plurality of first openings by which the first and the second bonding pads are exposed. The redistribution layer is disposed on the first passivation layer and extended from the second bonding pads to the wire bonding area. The redistribution layer has a plurality of third bonding pads located inside the wire bonding area. The second passivation layer disposed over the redistribution layer has a plurality of second openings by which the first and the third bonding pads are exposed. The bonding wires are connected to the chip structures and the circuit substrate, thus the chip structures are electrically connected to the circuit substrate.

In the stacked-chip package according to a preferred embodiment of the present invention, one end of the bonding wires is connected to the first bonding pads or the third bonding pads, and the other end of the bonding wires is connected to the circuit substrate.

In the stacked-chip package according to the preferred embodiment of the present invention, the bonding wires further comprise a plurality of first bonding wires and a plurality of second bonding wires. Two ends of each first bonding wire are respectively connected to the first bonding pads or the third bonding pads of two chip structures adjacent to each other, and two ends of each second bonding wire are respectively connected to the circuit substrate and the first bonding pads or the third bonding pads of the chip structure adjacent to the circuit substrate.

The stacked-chip package according to the preferred embodiment of the present invention further comprises a control chip. The control chip disposed on the topmost chip structure exposes the wire bonding area of the topmost chip structure, and the control chip electrically connects to the circuit substrate through the bonding wires.

In the chip structure and the stacked-chip package according to the preferred embodiment of the present invention, wherein the material of the redistribution layer comprises Au (gold), Cu (Copper), Ni (Nickel), TiW or Ti (Titanium).

In the chip structure and the stacked-chip package according to the preferred embodiment of the present invention, wherein the first bonding pads and the second bonding pads are disposed on the chip with peripheral type or area array type arrangement.

In the chip structure and the stacked-chip package according to the preferred embodiment of the present invention, wherein the first bonding pads and the third bonding pads are located in at least one row along with one side of the chip.

Since the first and the third bonding pads are located inside the wire bonding area, the chip structure provided by the present invention uses a region outside the wire boding area to directly hold another chip structure. In addition, in the stacked-chip package provided by the present invention, each chip structure on a higher layer can be directly stacked over a region outside the wire bonding area of the chip structure on a lower layer. Comparing to the conventional technique, the spacer is not required in the stacked-chip package of the present invention, thus the present invention can provide higher package integrity and less thickness.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Figure 1A:
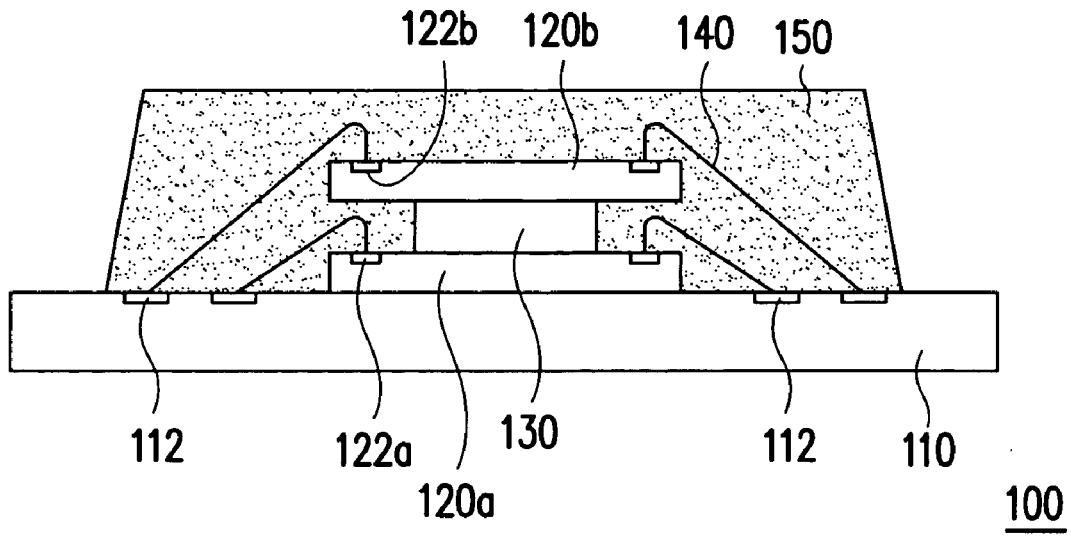
FIG. 1A is a schematic sectional view of a conventional stacked-chip package.
Figure 1B:
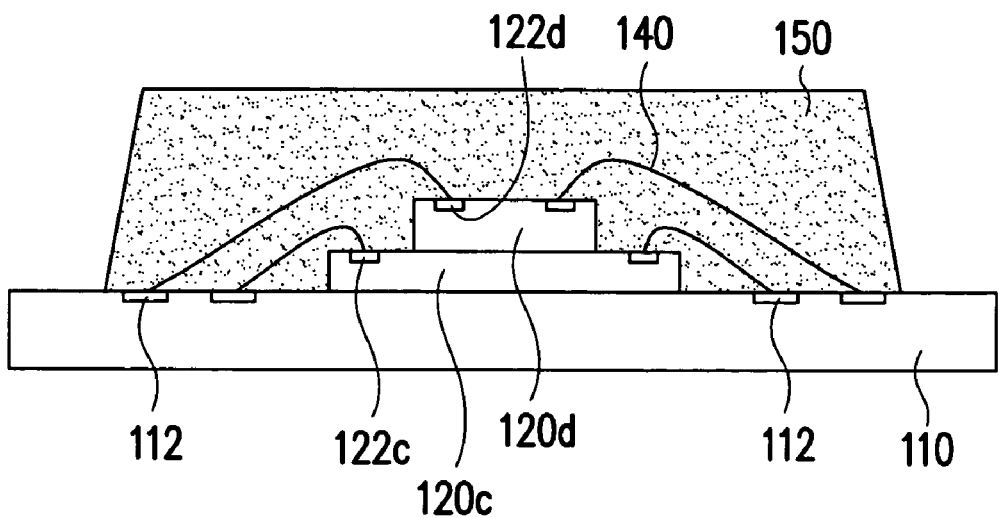
FIG. 1B is a schematic sectional view of another conventional stacked-chip package.
Figure 2A:
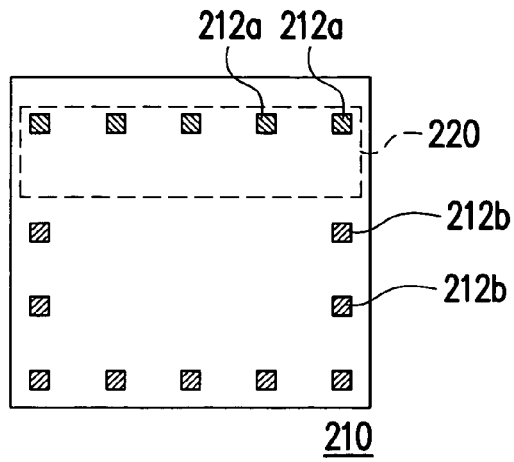
FIG. 2A~2C are the schematic diagrams illustrating a manufacturing process of the chip structure provided by the present invention.
Figure 2B:
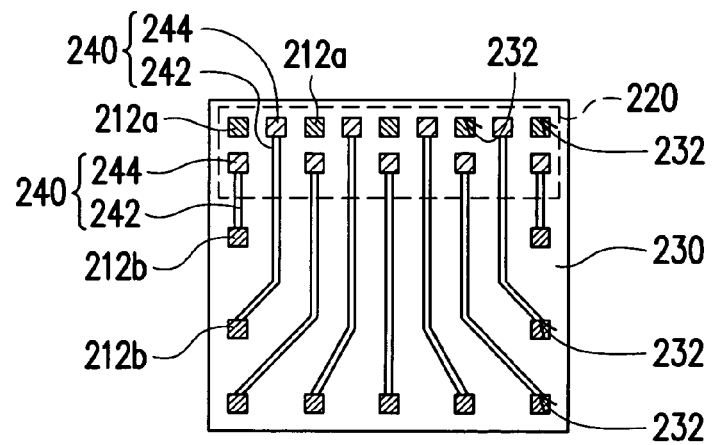
Figure 2C:
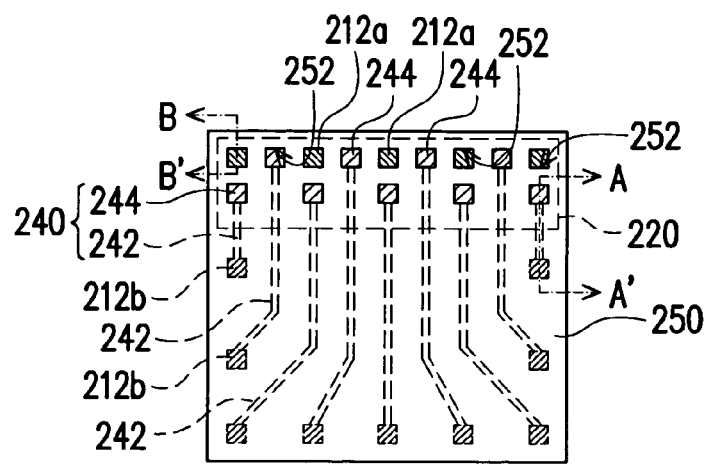

FIGS. 2A~2C are the schematic diagrams illustrating a manufacturing process of the chip structure provided by the present invention. Referring to FIG. 2A, first a chip 210 is provided, and a wire bonding area 220 is designed on one side adjacent to the chip 210, such that a plurality of bonding pads 212 on an active surface of the chip 210 is divided into the first bonding pads 212a and the second bonding pads 212b. The first bonding pads 212a are disposed inside the wire bonding area 220, and the second bonding pads 212b are disposed outside the wire bonding area 220.

Referring to FIG. 2B, a first passivation layer 230 is formed on the chip 210. The first passivation layer 230 has a plurality of first openings by which the first bonding pads 212a and the second bonding pads 212b are exposed. Then, a redistribution layer 240 is formed on the first passivation layer 230. The redistribution layer 240 comprises a plurality of bonding wires 242 and a plurality of third bonding pads 244. The third bonding pads 244 are located inside the wire bonding area 220 and the bonding wires 242 are extended from the second bonding pads 212b to the third bonding pads 244 respectively, such that the second bonding pads 212b are electrically connected to the third bonding pads 244. In addition, the material of the redistribution layer 240 may comprise Au (gold), Cu (Copper), Ni (Nickel), TiW, Ti (Titanium) or other electric conductive material.

It is to be noted that although the first bonding pads 212a and the second bonding pads 212b mentioned above are disposed on the active surface of the chip 210 with peripheral type arrangement, the first bonding pads 212a and the second bonding pads 212b may be disposed on the chip 210 with area array or other type arrangement. The second bonding pads 212b are electrically connected to the third bonding pads 244 through the bonding wires 242. Moreover, the present embodiment has no intention to limit the arrangement of the third bonding pads 244. Although the third bonding pads 244 and the first bonding pads 212a in FIG. 2B are arranged in two rows and disposed along with one side of the chip 210. The third bonding pads 244 and the first bonding pads 212a may be located inside the wire bonding area with an arrangement of a single row, double rows, multiple rows or other arrangements.

Referring to FIG. 2C, after the redistribution layer 240 is formed, a second passivation layer 250 is disposed over the redistribution layer 240 to form a chip structure 300. The second passivation layer 250 has a plurality of second openings 252 by which the first bonding pads 212a and the third bonding pads 244 are exposed.

Figure 3:
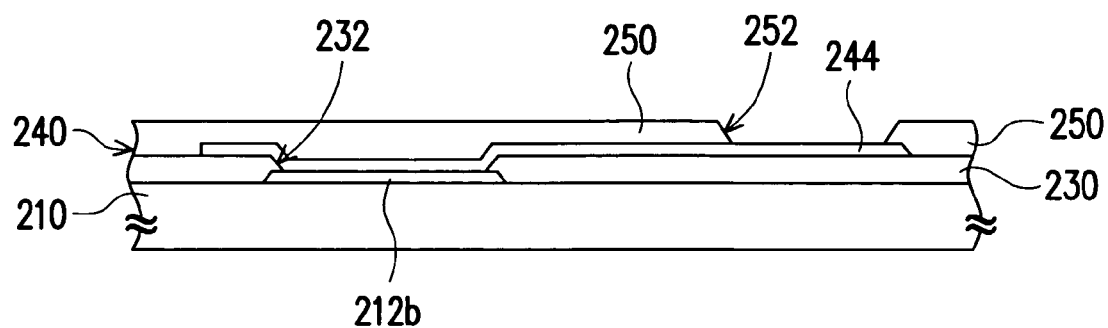
FIGS. 3 and 4 are the schematic sectional views along with the lines A–A' and B–B' in FIG. 2C.
Figure 4:
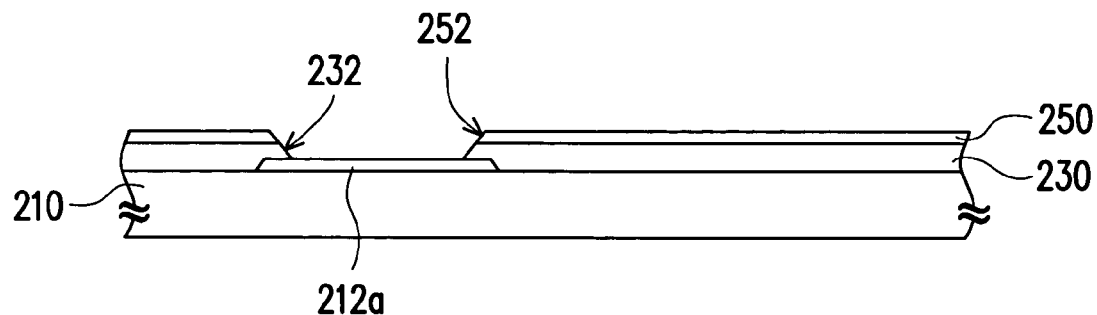

FIGS. 3 and 4 are the schematic sectional views along with the lines A–A' and B–B' in FIG. 2C. Referring to FIGS. 2C, 3, and 4, it is known that the chip structure 300 mainly comprises a chip 210, a first passivation layer 230, a redistribution layer 240 and a second passivation layer 250. The chip 210 comprises a wire bonding area 220 adjacent to one side of the chip 210. In addition, the chip 210 comprises a plurality of first bonding pads 212a and a plurality of second bonding pads 212b. The first bonding pads 212a are disposed inside the wire bonding area 220 and the second bonding pads 212b are disposed outside the wire bonding area 220.

The first passivation layer 230 disposed on the chip 210 has a plurality of first openings 232 by which the first bonding pads 212a and the second bonding pads 212b are exposed. The redistribution layer 240 is disposed on the first passivation layer 230 and extended from the second bonding pads 212b to the wire bonding area 220. The redistribution layer 240 has a plurality of third bonding pads 244 located inside the wire bonding area 220. The second passivation layer 250 disposed over the redistribution layer 240 has a plurality of second openings 252 by which the first bonding pads 212a and the third bonding pads 244 are exposed.

Since the first bonding pads 212a and the third bonding pads 244 are located inside the wire bonding area 220, a region outside the wire bonding area 220 on the second passivation layer 250 serves as a platform to hold another chip structure. In addition, in other embodiment of the present invention, the wire bonding area 220 may be designed on two sides adjacent to the chip 210. However, since the present embodiment is differed from the previous embodiment only in the position of the chip 210 where the wire bonding area 220 is located, its detail is omitted herein.

Figure 5:
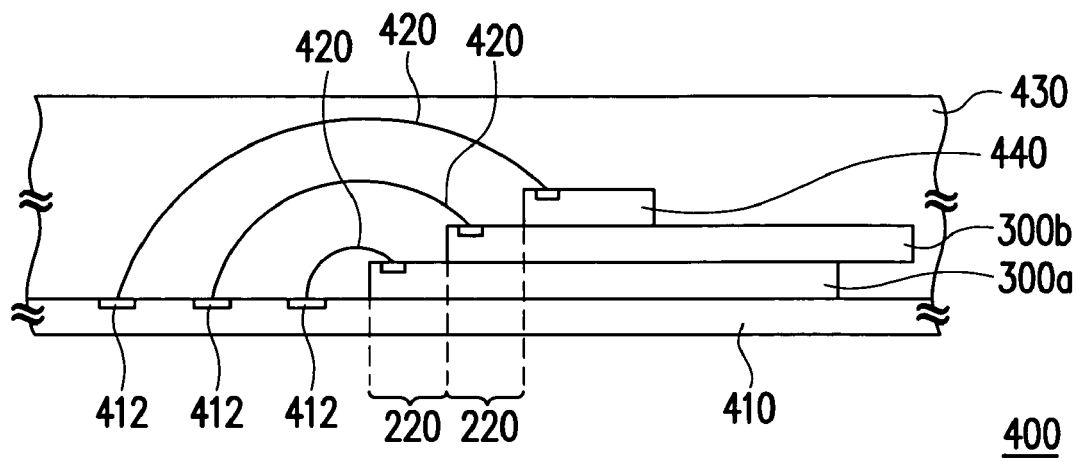
FIG. 5 is a schematic diagram of a stacked-chip package according to a preferred embodiment of the present invention.

Accordingly, the present invention further provides a stacked-chip package 400 based on the chip structure 300 as shown in FIG. 5. Referring to FIG. 5, the stacked-chip package 400 mainly comprises a circuit substrate 410, the chip structures 300a and 300b and a plurality of bonding wires 420. A plurality of fourth bonding pads 412 is disposed on the circuit substrate 410 and the chip structures 300a and 300b are stacked on the circuit substrate 410. The chip structures 300a and 300b are the same as the chip structure 300, thus its detail is omitted herein. One end of the bonding wires is connected to the first bonding pads 212a or the third bonding pads 244 of the chip structures 300a and 300b and the other end of the bonding wires is connected to the fourth bonding pads 412 of the circuit substrate 410, such that the chip structures 300a and 300b are electrically connected to the circuit substrate 410. Here, the material of the bonding wires may comprise Au (gold). Moreover, the stacked-chip package may further comprise an encapsulant 430. The encapsulant 430 disposed over the circuit substrate 410 encapsulates the chip structures 300a, 300b and the bonding wires 420.

It is to be noted that the chip structure 300b directly stacked on the chip structure 300a is disposed on a region outside the wire bonding area 220 for performing a subsequent wire bonding process. In addition, the present embodiment has no intention to limit the number of the chip structures stacked on the circuit substrate 410. One of the ordinary skills in the art may manufacture a stacked-chip package 400 having more than three chip structures 300 according to the method mentioned above.

Figure 6:
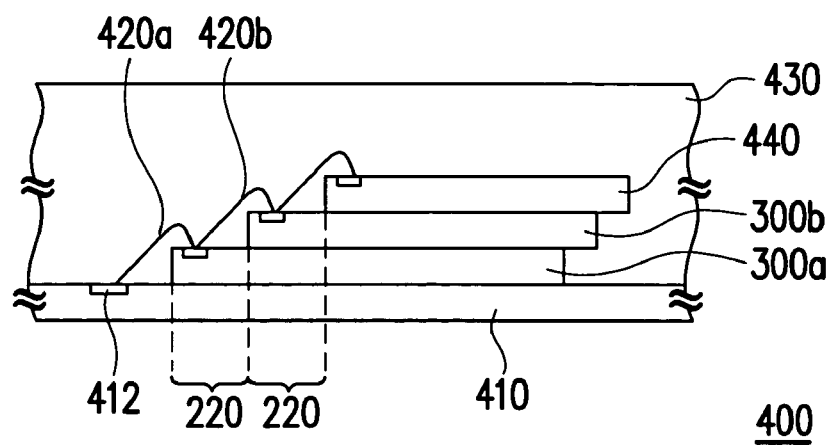
FIG. 6 is a schematic diagram of a stacked-chip package according to another preferred embodiment of the present invention.

Moreover, in another embodiment of the present invention, the electrical connection between the chip structures 300a, 300b and the circuit substrate 410 is as shown in FIG. 6. FIG. 6 is a schematic diagram of a stacked-chip package according to another preferred embodiment of the present invention. Referring to FIGS. 5 and 6, the major difference between the stacked-chip package 400 of FIG. 6 and the stacked-chip package 400 of FIG. 5 is that one end of the bonding wires 420a is connected to the first bonding pad 212a or the third bonding pad 244 of the chip structure 300a, and the other end of the bonding wire 420a is connected to the fourth bonding pad 412 of the circuit substrate 410. In addition, one end of the bonding wires 420b is connected to the first bonding pad 212a or the third bonding pad 244 of the chip structure 300a; and the other end of the bonding wire 420a is connected to the first bonding pad 212a or the third bonding pad 244 of the chip structure 300b. Accordingly, the chip structures 300a and 300b are electrically connected to the circuit substrate 410 through the bonding wires 420a and 420b. Since the stacked-chip package 400 of FIG. 6 is similar to the stacked-chip package 400 of FIG. 5, its detail is omitted herein.

Furthermore, in addition to stack the chip structures 300a and 300b on the circuit substrate 410, the present embodiment further stacks a control chip 440 on the chip structure 300b and exposes the wire bonding area 220 of the chip structure 300b. In addition, the chip structures 300a and 300b are electrically connected to the circuit substrate 410 through the bonding wires 420.

Figure 7:
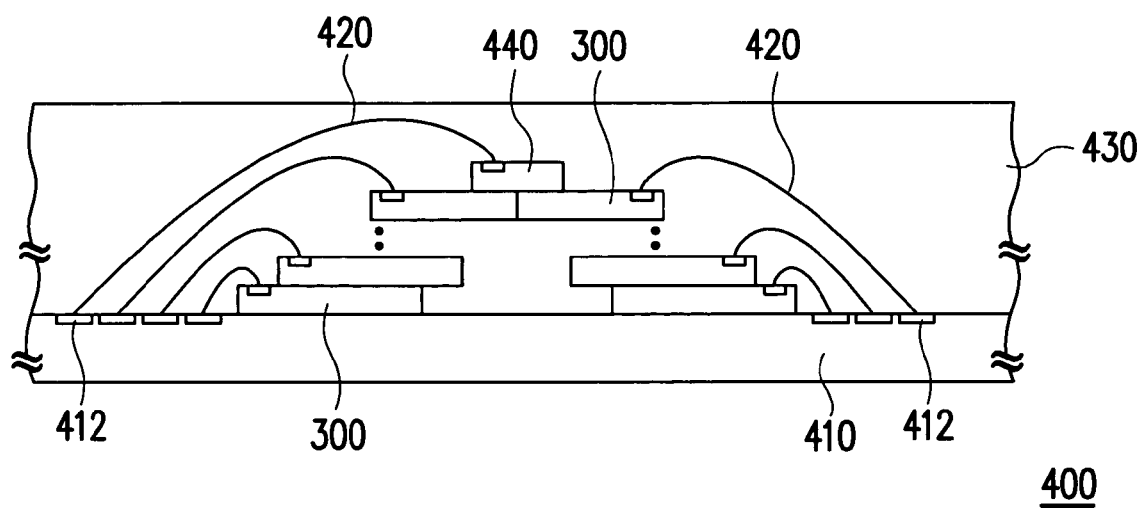
FIG. 7 is a schematic diagram of a stacked-chip package according to yet another preferred embodiment of the present invention.

The chip structures 300 of the stacked-chip package 400 may be stacked by means of the methods shown in FIGS. 5 and 6 or other methods. For example, the chip structures 300 may be stacked on the circuit substrate 410 by means of a pyramid shape as shown in FIG. 7. Certainly, in the stacked-chip package 400 of FIG. 7, the present embodiment may stack the control chip 440 on the chip structures.

In summary, in the chip structure provided by the present invention, the first bonding pads and the third bonding pads are intentionally disposed on one side of the chip structure by appropriately planning the wire bonding area and the redistribution layer, such that the chip structure can use a region outside the wire bonding area to directly hold another chip structure. Accordingly, comparing to the conventional technique, the stacked-chip package formed by stacking the chip structures mentioned above can provide less thickness and higher package integrity.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A chip structure, comprising:
   a chip having a wire bonding area adjacent to one side or two sides adjacent to each other of the chip, wherein the chip comprises a plurality of first bonding pads disposed inside the wire bonding area and a plurality of second bonding pads disposed outside the wire bonding area;
   a first passivation layer disposed on the chip, wherein the first passivation layer has a plurality of first openings by which the first bonding pads and the second bonding pads are exposed;
   a redistribution layer disposed on the first passivation layer, wherein the redistribution layer extends from the second bonding pads to the wire bonding area, and the redistribution layer has a plurality of third bonding pads located inside the wire bonding area; and a second passivation layer disposed over the redistribution layer, wherein the second passivation layer has a plurality of second openings by which the first bonding pads and the third bonding pads are exposed.

2. The chip structure of claim 1, wherein a material of the redistribution layer comprises Au (gold), Cu (Copper), Ni (Nickel), TiW, or Ti (Titanium).

3. The chip structure of claim 1, wherein the first bonding pads and the second bonding pads are disposed on the chip with peripheral type arrangement.

4. The chip structure of claim 1, wherein the first bonding pads and the second bonding pads are disposed on the chip with area array type arrangement.

5. The chip structure of claim 1, wherein the first bonding pads and the third bonding pads are disposed in at least one row along with one side of the chip.

6. A stacked-chip package, comprising:
a circuit substrate;
a plurality of chip structures, each comprising:
  a chip having a wire bonding area adjacent to one side or two sides adjacent to each other of the chip, wherein the chip comprises a plurality of first bonding pads disposed inside the wire bonding area and a plurality of second bonding pads disposed outside the wire bonding area;
  a first passivation layer disposed on the chip, wherein the first passivation layer has a plurality of first openings by which the first bonding pads and the second bonding pads are exposed;
  a redistribution layer disposed on the first passivation layer, wherein the redistribution layer extends from the second bonding pads to the wire bonding area, and the redistribution layer has a plurality of third bonding pads located inside the wire bonding area;
  a second passivation layer disposed over the redistribution layer, wherein the second passivation layer has a plurality of second openings by which the first bonding pads and the third bonding pads are exposed, wherein the chip structures are stacked so as to expose the wire bonding area of each of the chip structures; and
a plurality of bonding wires connecting the chip structures and the circuit substrate, such that the chip structures are electrically connected to the circuit substrate.

7. The stacked-chip package of claim 6, wherein one end of the bonding wires is electrically connected to the first bonding pads and the third bonding pads, and the other end of the bonding wires is electrically connected to the circuit substrate.

8. The stacked-chip package of claim 6, wherein the bonding wires further comprise a plurality of first bonding wires and a plurality of second bonding wires, and two ends of each of the first bonding wires are respectively connected to the first bonding pads and the third bonding pads of two chip structures adjacent to each other; two ends of each of the second bonding wires are respectively connected to the circuit substrate and the first bonding pads or the third bonding pads of the chip structure adjacent to the circuit substrate.

9. The stacked-chip package of claim 6, further comprising a control chip disposed on the topmost chip structure so as to expose the wire bonding area of the topmost chip structure, wherein the control chip is electrically connected to the circuit substrate through the bonding wires.

10. The stacked-chip package of claim 6, wherein a material of the redistribution layer comprises Au (gold), Cu (Copper), Ni (Nickel), TiW, or Ti (Titanium).

11. The stacked-chip package of claim 6, wherein the first bonding pads and the second bonding pads of the chip structures are disposed on the chip with peripheral type arrangement.

12. The stacked-chip package of claim 6, wherein the first bonding pads and the second bonding pads of the chip structures are disposed on the chip with area array type arrangement.

13. The stacked-chip package of claim 6, wherein the first bonding pads and the third bonding pads of the chip structures are disposed in at least one row along with one side of the chip.

* * * * *